US012768883B2

(12) United States Patent
Bae

(10) Patent No.: US 12,768,883 B2
(45) Date of Patent: Oct. 20, 2026

(54) MICROELECTRONIC TEST INTERFACE SUBSTRATES, DEVICES, AND METHODS OF MANUFACTURE THEREOF PROBE HEAD TEST CONTACT PIN SHIELD AND DIELECTRIC INSULATION ON TOP LAYER OF BUILDUP REDISTRIBUTION LAYER SYSTEM

(71) Applicant: Raymond Won Bae, Danville, CA (US)

(72) Inventor: Raymond Won Bae, Danville, CA (US)

( * ) Notice: Subject to any disclaimer, the term of this patent is extended or adjusted under 35 U.S.C. 154(b) by 367 days.

(21) Appl. No.: 17/515,404

(22) Filed: Oct. 30, 2021

(65) Prior Publication Data

US 2023/0140814 A1 May 4, 2023

(51) Int. Cl.

| | |
|---|---|
| ***H05K 1/02*** | (2006.01) |
| ***G01R 3/00*** | (2006.01) |
| ***G01R 31/28*** | (2006.01) |

(52) U.S. Cl.
CPC ........... *G01R 31/2886* (2013.01); *G01R 3/00* (2013.01); *H05K 1/0296* (2013.01)

(58) Field of Classification Search
CPC ....... H05K 1/0296; G01R 3/00; G01R 3/2886
See application file for complete search history.

(56) References Cited

U.S. PATENT DOCUMENTS

2021/0366877 A1* 11/2021 Wu .................... H01L 23/5384

* cited by examiner

*Primary Examiner* — Jeremy C Norris
(74) *Attorney, Agent, or Firm* — IP Strategy Consulting

(57) ABSTRACT

An embodiment of the present invention provides a method and system of manufacturing a redistribution platform comprising and providing a base substrate; buildup layer level thereof vertical electrical shield and insulation on the top layer test pad to provide EMI protection from probe contact pins and another adjacent conductor.

19 Claims, 4 Drawing Sheets

MICROELECTRONIC TEST INTERFACE SUBSTRATES, DEVICES, AND METHODS OF MANUFACTURE THEREOF PROBE HEAD TEST CONTACT PIN SHIELD AND DIELECTRIC INSULATION ON TOP LAYER OF BUILDUP REDISTRIBUTION LAYER SYSTEM

TECHNICAL FIELD

An embodiment of the present invention relates generally to microelectronic buildup redistribution layer system.

BACKGROUND

Electromagnetic interference (EMI) is prevalent throughout the conductor circuits in the test interface substate. As semiconductor fabrication technology advances continue to be implemented, the critical dimension or spacing between electrical test contact pads and bumps pitch of dies or chips on the semiconductor wafer continues to shrink. Apparently, testing probe head comprising a plurality of testing probe are also increasing in numbers with pitch between probes getting smaller for wafer level testing and devices.

A technology bottleneck occurs that is associated with existing known testing probe head designs and probe assembly techniques that do not readily support such EMI protection in small testing pad micro bump pitches in wafer level testing and devices.

The shielding and dielectric insulation around the probe head probe area can reduces electrical noise and reduces its impact on signals and also lowers electromagnetic radiation for the better and reliable testing. Shielding also prevents crosstalk between near or surrounding probes and test pads.

As users become more empowered with the growth of computing devices, new and old paradigms begin to take advantage of this new device space. There are many technological solutions to take advantage of this new device capability and device miniaturization. However, reliable testing and faster delivery of wafers through new devices has become a concern for manufactures.

Thus, a need still remains for a microelectronic buildup redistribution layer system for testing of wafers and devices. In view of the ever-increasing high-speed applications and performance, better commercial competitive pressures, along with growing consumer expectations and the diminishing opportunities for meaningful product differentiation in the marketplace, it is increasingly critical that answers be found to these problems. Additionally, the need to provide manufacturing capabilities of redistribution system to provide the EMI vertical shield on the test substrate top (wafer or device) side to provide the shields on the contact points of probe head probes. This improves efficiencies, performance and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a microelectronic buildup redistribution layer system, including: a base carrier substrate; conductor traces and a dielectric structure on the substrate, including a plurality of multi-layers.

An embodiment of the present invention provides a method of manufacture thereof providing vertical EMI vertical shield and/or dielectric insulation on the test substrate top (wafer or device) side to provide the shields on the contact points of probe head probes. Microelectronic buildup redistribution layer system including: providing a base carrier substrate; forming a plurality of multi-layers on the substrate, conductor traces, conductor vias and a dielectric structure on the substrate.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
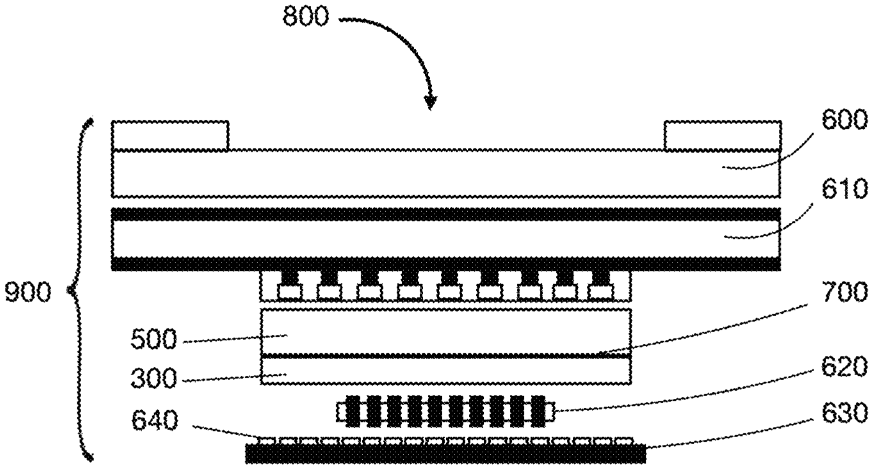
FIG. 1 is a schematic side view of a probe card system in an embodiment of the present invention microelectronics test interface redistribution layer system 300 is integrated.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

In this embodiment, the buildup redistribution vertical electrical shield on top layer probe head contact pads. Shields are connected to the single ground layer. However, it can be routed and connected with any layers and conductors.

The designation and usage of the term first, second, third, etc. is for convenience and clarity and is not meant limit a particular order. The steps or processes described can be performed in any order to implement the claimed subject matter.

Referring now to FIG. 1, therein is shown an embodiment of microelectronic test interface substrate system schematic side view of a probe card system 800 and an embodiment of the present invention 700 is integrated. The system 800 is a system for providing interconnection between different devices. For example, the system 800 can be a component in a wafer testing system 900 or a substrate in an integrated circuit packaging system. As an example, the wafer testing system 900 can include a mechanical stiffener 600, a printed circuit board 610, a redistribution test interface platform 700 consist of the base carrier substrate 500 and redistribution substate platform 300, and a probe head 620. The mechanical stiffener 600, the printed circuit board 610, the redistribution test interface platform 700, and the probe head 620 are components for a system to test a semiconductor wafer 630. The semiconductor wafer 630 can include a die 640 with electronic components, such as circuits, integrated circuits, logic, integrated logic, or a combination thereof fabricated thereon.

Figure 2:
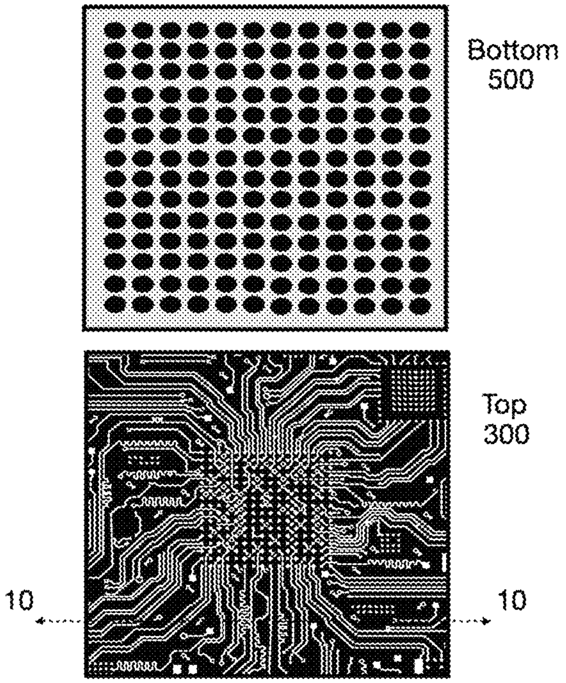
FIG. 2 schematic view of an embodiment of microelectronic test interface substrate system with bottom base carrier substrate 500 view and microelectronic buildup redistribution layer 300 top view with conductor traces and test pads.

Referring now to FIG. 2, therein is shown an embodiment of microelectronic test interface substrate system top view of microelectronic buildup redistribution layer 300 of FIG. 1 and bottom view of base carrier substrate 500 of FIG. 1 of the redistribution test interface substrate platform 700. The bottom conductor pads of the test interface substate are interconnecting toward the printed circuit board 610 of FIG. 1. The top side of the test interface substrates are interconnecting to the probe head 620 of FIG. 1. For wafer chip 630 of FIG. 1 and other logic and integrated devices to be tested.

The redistribution platform 700 is a structure for providing interconnection between two devices. For example, the redistribution platform 700 can be a space transformer, a redistribution structure for a multi-die package, or a combination thereof. The redistribution platform 700 can provide electrical and functional connectivity between semiconductor wafer 630, the die 640, or a combination thereof, and the rest of the redistribution system 800.

Figure 3:
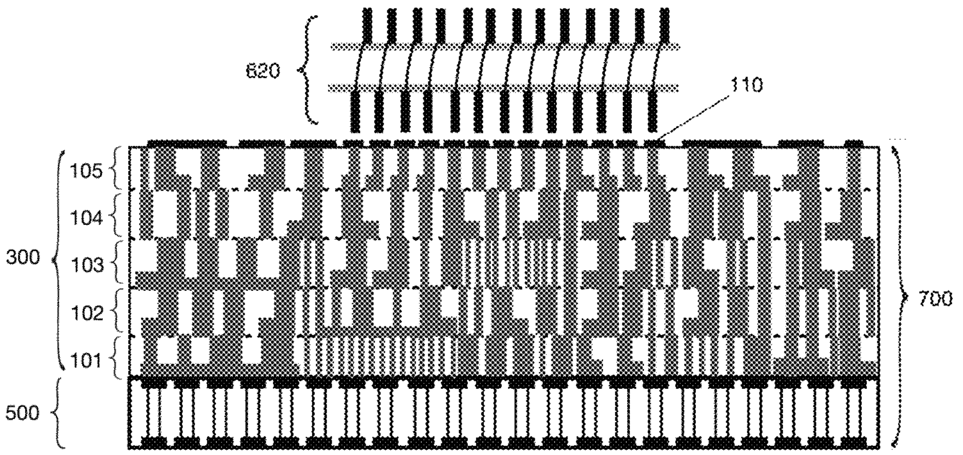
FIG. 3 is a schematic cross-sectional side view of an embodiment of microelectronic test interface substrate system 700 with the 5 buildup redistribution layers 101, 102, 103, 104 and top layer 105 with the test pads 110.

Referring now to FIG. 3, therein is shown an embodiment of microelectronic test interface substrate system cross-sectional side view of the test interface substrate system 700; base carrier substrate 500, the microelectronics redistribution system 300; For illustrative purpose, the redistribution conductors and shields are depicted having a similar shape from the side view, although it is understood that the system 700 can have a different shape and more or less layers than the illustration. For example, the redistribution conductor system in 101, 102, 103, 104 and 105 can have any shapes and thickness to meet the needs of testing interface design requirement, such as a square, or rectangular shape, a triangular shape, pentagonal shape, or any other polygonal shapes and curves.

The base carrier substrate 500 can be a rigid foundation or base layer for the redistribution player platform 300. The substrate 500 can include an electrically insulating material, such as a ceramic based or polymer composite based material.

For illustrate purpose, the probe head system 620 is shown and align to buildup redistribution top layer system 105 test pad 110.

The microelectronics buildup redistribution system 300 layers can be signal layer, ground layer, power and plane layer or the combination thereof.

Figure 4:
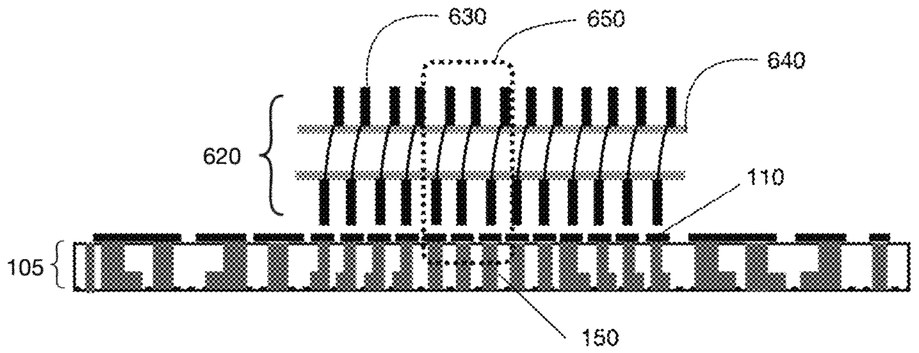
FIG. 4 is a schematic cross-sectional side view of an embodiment of microelectronic test interface substrate system 300 top layer 105 with probe test pad 110 and the probe head system 620. In this embodiment of probe head system 620, probe pin 630 and guide plate 640 are in alignment with redistribution top layer 105 test pad 110.

Referring now to FIG. 4, therein is shown an embodiment of microelectronic test interface substrate system cross-sectional side view of the buildup redistribution test interface substrate system 300 top layer 105 and the probe head system 620 of FIG. 3. For illustration purpose, the probe pin system 630 depicted the one shape, although it is understood that the system 620 can have a different shape and type of probe pin system 630 and different type of probe pin supporting plate system 640. For example, the probe head system 620 can have the multiple of thousands probe pins, and the pin-to-pin distance (pitch) can in range micron (μm).

The redistribution platform 300 and probe head system 620 can provide electrical and functional connectivity between the semiconductor wafer, semiconductor dice, or a combination thereof for system testing, such as wafer testing, die testing, package testing, or inter-package testing.

Figure 5:
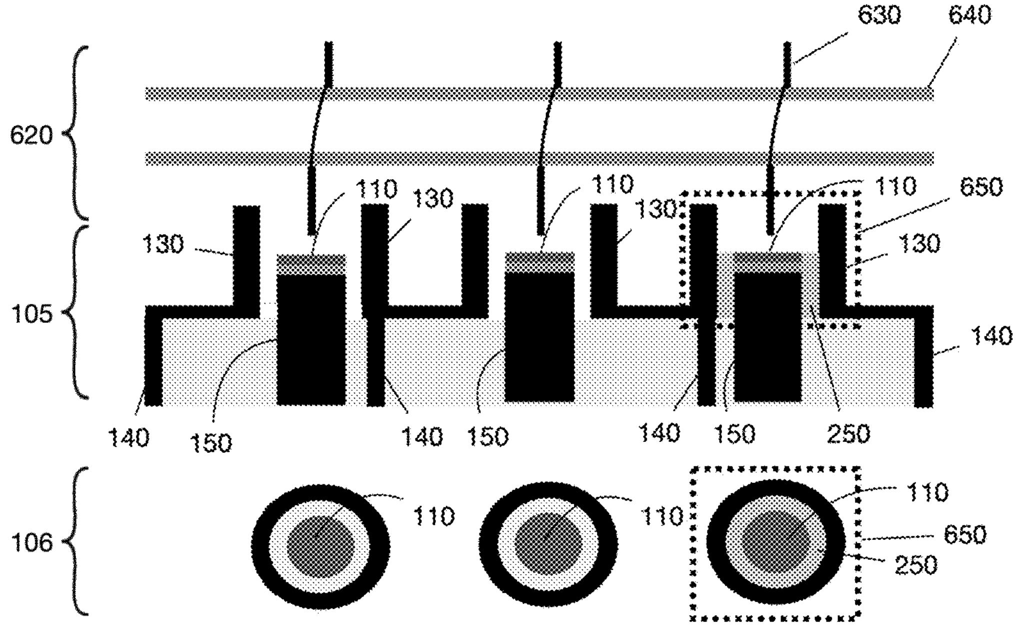
FIG. 5 is a schematic cross-sectional close side view and top view of an embodiment of microelectronic test interface substrate system 300 top layer 105 with probe test pad 110 and the probe head system in in dotted box system 650.

Referring now to FIG. 5 is a schematic cross-sectional close side view and top view of an embodiment of microelectronic test interface substrate system 300 top layer 105 with probe test pad 110 and the probe head system in in dotted box system 650 In FIG. 5. The buildup redistribution test pad system 110 is protected by vertical buildup shield system 130. For illustrative purpose, vertical buildup system 130 is connected to connecting ground via system 140.

The buildup redistribution top layer test pad 110 is normally plated with Nickle (Ni) and Hard Gold (Au), but not limited to these earth metal.

The platform system 650 is showing the gap (open area) between the test pad and the buildup redistribution vertical shield is filled with the dielectric insulator 250, such as solder mask, polyimide, epoxy, or other polymer materials. For example, this can prevent the probe pin 630 slid in the gap which can cause the pin damage.

Figure 6:
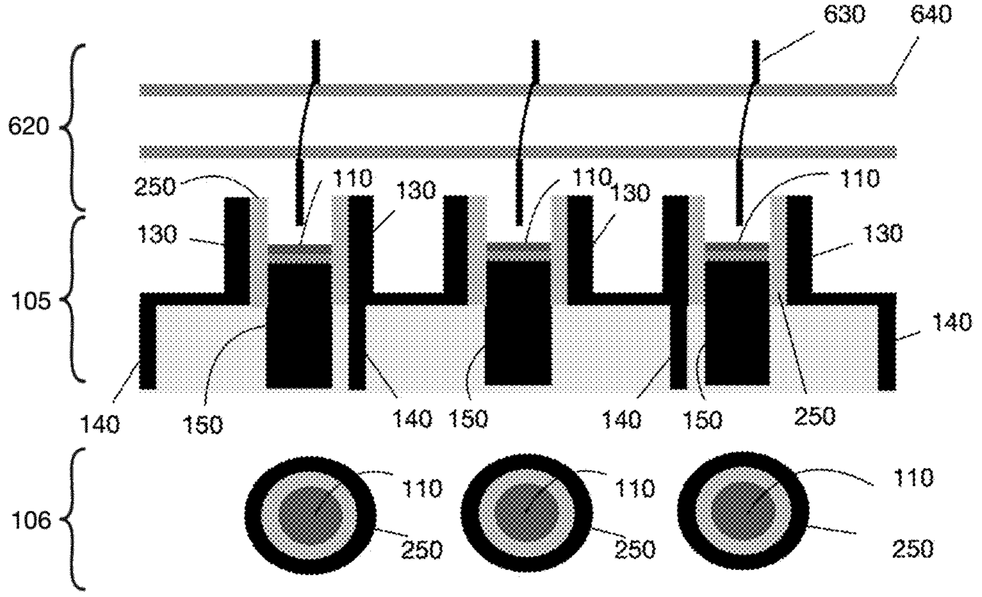
FIG. 6 is a schematic cross-sectional close side view and top view of an embodiment of microelectronic test interface substrate system 300 top layer 105 with probe test pad 110 insulated from the inner vertical shields.

Referring now to FIG. 6 is a schematic cross-sectional close side view and top view of an embodiment of microelectronic test interface substrate system 300 top layer 105 with probe test pad 110 and the probe head system in in dotted box system 650 In FIG. 5. The buildup redistribution test pad system 110 is protected by vertical buildup shield system 130. For illustrative purposes, buildup redistribution inner vertical shields are completely insulated.

It has been discovered that the offset of X and Y coordinates probe pin and the test pad can damage the pads and test pads. The inner vertical shield wall can also provide the protection.

For illustration purpose, the buildup redistribution top layer test pad system 110 depicted the one shape, although it is understood that the system 110 can have a different shape, thickness (height) and type. For example, the redistribution top layer test pad system 110 can have the multiple of thousands test pads, and the pad-to-pad distance (pitch) can in range micron (μm).

Based on the buildup redistribution test pad shape and sizes, the buildup redistribution buildup shield and insulators can also have a different shape, thickness (height) and type.

Figure 7:
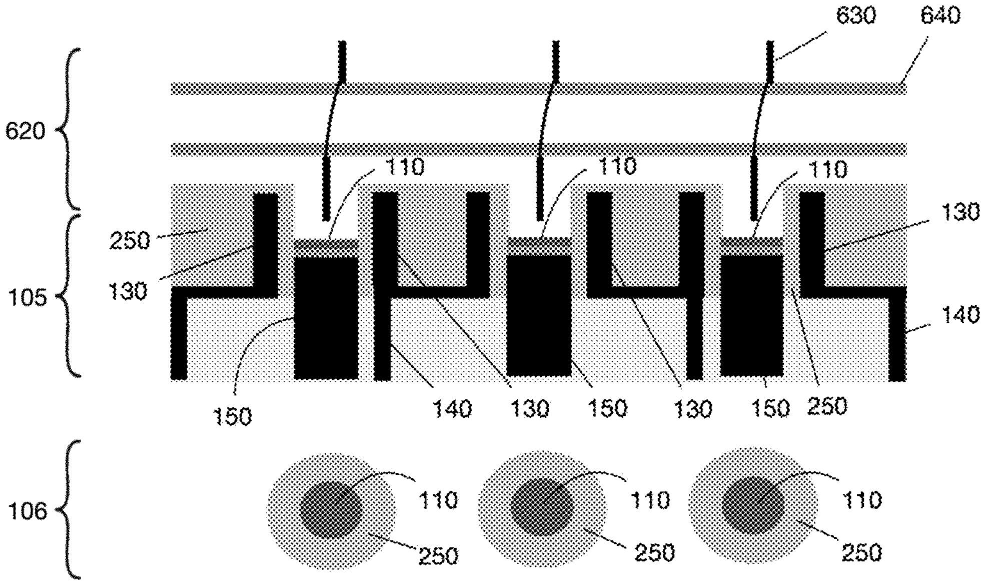
FIG. 7 is a schematic cross-sectional close side view and top view of an embodiment of microelectronic test interface substrate system 300 top layer 105 with probe test pad 110 and top layer area insulated from the vertical shields.

Referring now to FIG. 7 is a schematic cross-sectional close side view and top view of an embodiment of microelectronic test interface substrate system 300 top layer 105 with probe test pad 110 and the probe head system in in dotted box system 650 In FIG. 5. The buildup redistribution test pad system 110 is protected by vertical buildup shield system 130. For illustrative purposes, buildup redistribution top layer test pad area is completely insulated and only to expose the test pads. This depicts the probe pin system 630 being accidentally contacting other conductors including the buildup vertical shield.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method of manufacturing microelectronic buildup redistribution layer system comprising:

providing a substrate, wherein the substrate includes a base carrier that is a quartz wafer;

forming a plurality of microelectronic redistribution layers on the substrate, the redistributions layers including a dielectric layer and conductive traces embedded within the dielectric layer;

forming a multi-layer structure by cross-linking the microelectronic redistribution layers by via conductors;

forming in the top dielectric layer a series of probe test pads coupled to the conducting vias;

forming a conducting vertical shield surrounding each probe test pad and extending a distance above the probe test pad, wherein the conducting vertical shield couples to a grounding system; and forming a dielectric insulator encapsulating the conducting vertical shield.

2. Microelectronic buildup redistribution layer system comprising:

a substrate comprising base carrier, dielectric formed in layers adjacent to and on top of the base carrier, conductor traces embedded in the dielectric layers, and conductor vias connecting the dielectric layers, wherein the base carrier is a quartz wafer;

wherein the top dielectric layer further comprises:

a series of probe test pads coupled to the conducting vias;

a conducting vertical shield surrounding each probe test pad and extending a distance above the probe test pad, wherein the conducting vertical shield couples to a grounding system; and a dielectric insulator encapsulating the conducting vertical shield.

3. Microelectronic buildup redistribution layer system of claim 2, wherein the base carrier is a ceramic material in construction of single or multi-layers.

4. Microelectronic buildup redistribution layer system of claim 2, wherein the base carrier is an organic, printed circuit board, material in construction of single or multi-layers.

5. Microelectronic buildup redistribution layer system of claim 2, wherein the base carrier is a glass.

6. Microelectronic buildup redistribution layer system of claim 2, wherein the dielectric is a polyimide-based polymer material.

7. Microelectronic buildup redistribution layer system of claim 2, wherein the dielectric is an epoxy-based polymer material.

8. Microelectronic buildup redistribution layer system of claim 2, wherein the dielectric is a resin-based polymer material.

9. Microelectronic buildup redistribution layer system of claim 2, wherein the base carrier includes a through substrate via in the substrate and connected to the conductor traces.

10. Microelectronic buildup redistribution layer system of claim 2, wherein the substrate is a polymer composite substrate.

11. Microelectronic buildup redistribution layer system of claim 2, wherein the conductor vias provide an interlocking function between the conductor traces in a top layer and the conductor traces in a bottom layer.

12. The method of claim 1, wherein forming the microelectronic redistribution layers includes the polymer layer as a polyimide-based polymer material.

13. The method of claim 1, wherein forming the redistribution layers includes the polymer layer as an epoxy-based polymer material.

14. The method of claim 1, wherein providing the substrate includes providing the substrate including a through substrate vias and forming the redistribution layers include the conductive traces connected to the through substrate via.

15. The method of claim 1, wherein providing the substrate includes providing a ceramic substrate.

16. The method of claim 1, wherein providing the substrate includes providing a polymer composite substrate.

17. The method of claim 1, wherein providing the substrate includes providing many base materials.

18. The method of claim 1, wherein proving the substrate includes providing no lamination process for the multi-layered redistribution system.

19. The method of claim 1, wherein proving the substrate includes layer to layer buildup process for the multi-layered redistribution system.

* * * * *